United States Patent [19]
May

[11] Patent Number: 5,764,125
[45] Date of Patent: Jun. 9, 1998

[54] SUPPRESSOR CASE WITH ROCKING FERRITE

[75] Inventor: James P. May, Scranton, Pa.

[73] Assignee: FerriShield, Inc., New York, N.Y.

[21] Appl. No.: 785,954

[22] Filed: Jan. 22, 1997

[51] Int. Cl.⁶ .......................... H01F 17/06; H01F 27/02; H01F 27/76
[52] U.S. Cl. .................. 336/92; 324/127; 333/12; 336/176; 336/210; 336/212
[58] Field of Search .......................... 336/174, 175, 336/176, 92, 233, 229, 212, 210; 324/127; 333/81 R, 12, 182, 243, 183

[56] References Cited

U.S. PATENT DOCUMENTS

| | | | |
|---|---|---|---|
| 4,005,380 | 1/1977 | Heilmann et al. | 336/176 |
| 4,972,167 | 11/1990 | Fujioka | 336/175 |
| 5,343,184 | 8/1994 | Matsui et al. | 336/175 |

FOREIGN PATENT DOCUMENTS 62-014770  4/1987  Japan .................. 336/175

*Primary Examiner*—Thomas J. Kozmar
*Attorney, Agent, or Firm*—Notaro & Michalos P.C.

[57] ABSTRACT

A noise suppressor for engagement over a cable or ribbon, has a pair of ferrite core halves held in a pair of case halves which are closed around the cable or ribbon. The noise suppressor has a pair of case portions made of resilient material, each case portion having opposite side walls and a floor for defining a space with an open top for receiving a ferrite portion, and ends for passing the conductor. Hinges and latches or latches only hold the case portions together in a closed position around a conductor with the open tops of the case portions facing each other. Ferrite portions are in each case portion, each ferrite portion having a channel and at least one face. The faces engage each other and the channels merging when the case portions are in the closed position for passage of the conductor through the channel. A raised platform on the floor of each case portion is made as one piece with the case portion and extends into the space and into engagement of the ferrite portion. The platform is spaced inwardly of the opposite side walls and ends of the case portion for allowing the ferrite which is in engagement with the platform to rock so that when the case portions are in the closed position, the faces engage flatly against each other and are held securely in that position by a slight distortion of the top and bottom case floors.

9 Claims, 1 Drawing Sheet

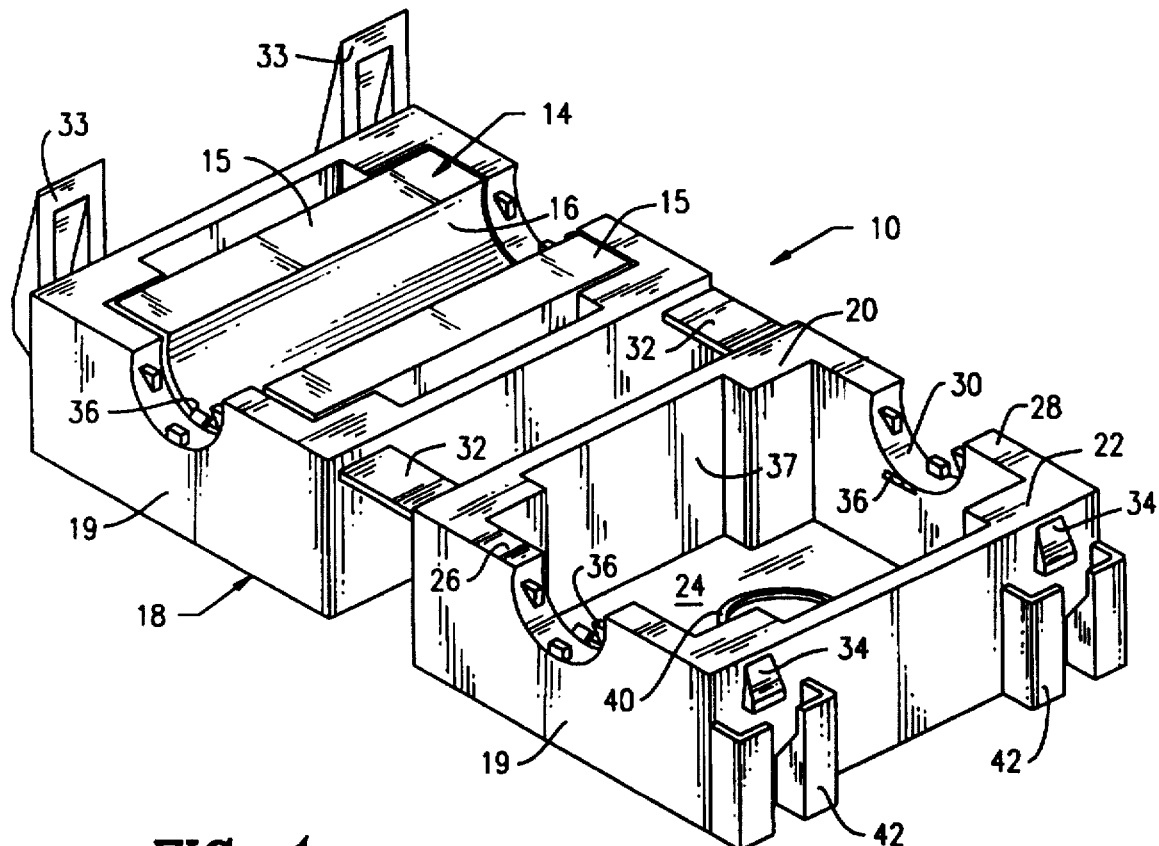
FIG. 1
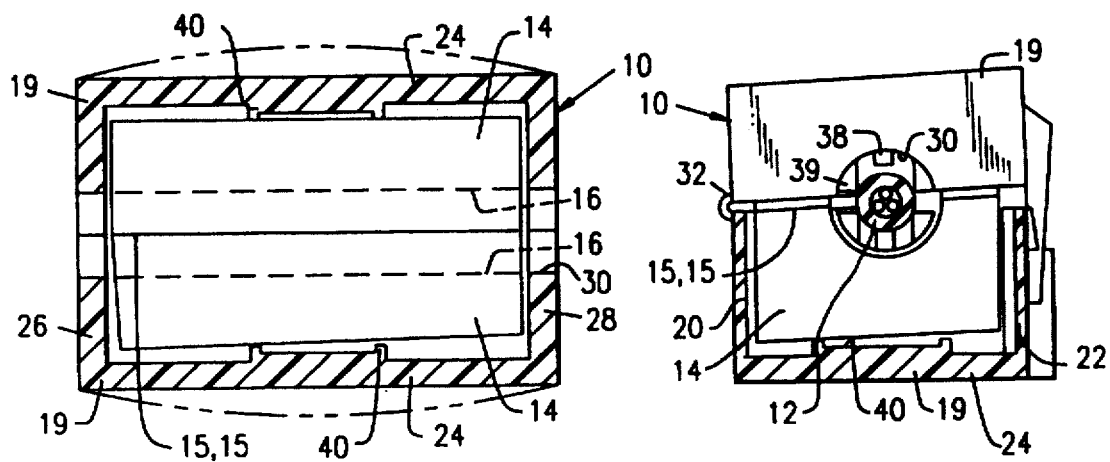
FIG. 2
FIG. 3

SUPPRESSOR CASE WITH ROCKING FERRITE

FIELD AND BACKGROUND OF THE INVENTION

The present invention relates in general to ferrite shields for suppressing high frequency noise in cables, and in particular to a new and useful ferrite suppressor case which firmly secures a pair of ferrite halves around a cable or conductor ribbon.

Ferrite suppressors are manufactured in geometries which use about one cubic inch of ferrous oxide material cast into various cylindrical or rectangular shapes. A hole is provided in the suppressor through which a cable or wire can pass. The cables which use this type of product are data transmission electronic circuits, usually processing frequencies from computer sources. Such a wire or cable can act as an antenna by either receiving or transmitting other unwanted frequencies.

Certain Federal Communication Commission (FCC) regulations require suppression or elimination of these unwanted frequencies. Also many computer devices require the same type of suppression to enhance overall system performance. Ferrite shields installed on the cable suppress the higher, unwanted frequency signals while permitting the lower data frequencies to pass unaltered. Thus, the undesirable "antenna characteristic" of a cable is controlled.

An advancement to the original solid ferrite designs has been to split the ferrite in half. This allows the two halves to be joined over the wire. A coarse and unsophisticated method of holding the halves together has been to simply tape or wrap them with a wire wrap tie.

The use of a reusable tape fastener to hold the halves of a ferrite shield together is disclosed in U.S. Pat. No. 4,983, 932. The use of clam shell cases to hold the ferrite shield halves together is also disclosed in U.S. Pat. No. 5,003,278 to the inventor of the present application and U.S. Pat. No. 4,972,167. U.S. Pat. No. 5,003,278 is incorporated here by reference. Also see U.S. Pat. Nos. 5,486,803, 4,885,559 and 4,873,505, which disclose the use of clam shell case halves for enclosing ferrite material halves, and for retaining the halves and biasing the ferrite halves toward each other. A need remains for a simple case for ferrite halves which easily yet securely retains the halves when the case is open, yet firmly and squarely presses flat faces of the halves against each other, when the case is closed around a cable or ribbon.

SUMMARY OF THE INVENTION

An object of the present invention is to provide a noise suppressor which retains a pair of ferrite halves in a pair of case halves, and aligns and presses faces of the ferrite halves against each other in a simple and effective manner.

Accordingly, a further object of the present invention is to provide a noise suppressor for engagement around a conductor, comprising: a pair of case portions made of resilient material, each case portion having opposite side walls and a floor for defining a space with an open top for receiving a ferrite portion, and ends for passing a conductor; connecting means for holding the case portions together in a closed position around a conductor with the open tops of the case portions facing each other; a ferrite portion in each case portion, each ferrite portion having a channel and at least one face, the faces engaging each other and the channels merging when the case portions are in the closed position for passage of a conductor through the channel; and a raised platform on the floor of one or both of the case portions, the platform being made as one piece with the case portion and extending into the space and into engagement of the ferrite portion, the platform being spaced inwardly of the opposite side walls and the ends of the case portion for allowing the ferrite(s) to rock so that when the case portions are in the closed position, the faces engage flatly against each other.

A further object of the present invention is to provide a positive inward pressure on the ferrites contained therein which is derived from a slight distortion of the top and/or bottom of the case floors and which will have less resistance to relaxation of such pressure over time and at elevated temperatures, extending both shelf life and application life of the product.

A further object of the present invention is to provide a noise suppressor for engagement around a conductor which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiment of the invention is illustrated.

BRIEF DESCRIPTION OF THE DRAWINGS

In the drawings:

FIG. 1 is a perspective view of an embodiment of the invention for accommodating a cable, with the case halves open;

FIG. 2 is a longitudinal sectional view of the embodiment of FIG. 1 with the case closed; and FIG. 3 is a radial sectional view, partly in elevation, of the embodiment of FIG. 1 with the case closed.

DESCRIPTION OF THE PREFERRED EMBODIMENTS

Referring to the drawings in particular, the invention embodied in FIG. 1 comprises a noise suppressor generally designated 10 for engagement over a conductor, such as a cable 12 in FIG. 3, or a ribbon or other conductor for which the case of the invention can be specially shaped.

Throughout this disclosure, the term "conductor" will be utilized both to identify a cable having a generally cylindrical or oval cross section such as cable 12 in FIG. 3, and also ribbon shaped cables containing a plurality of conductors lying side by side and spaced across the width of the ribbon.

Suppressor 10 in FIG. 1 contains a ferrite core half 14 having a semi-cylindrical core passage 16 extending from one end of the core to an opposite end thereof. Ferrite half 14 has a pair of flat ground faces 15 and when mated with a like core half as illustrated in FIG. 2, passages 16 form a cylindrical passage for the cable 12. Passages 16 together have a diameter which is greater than the outer diameter of cable 12 for easily receiving the cable through the mated core halves. Core halves 14 are advantageously made of ferrite or other electrical noise absorbing material and, held at a selected location along the length of the cable 12, will absorb interference and electrical noise emanating from or existing around the cable.

A case 18 of insulating, preferable synthetic or plastic material, is formed of two case halves 19 which each receive one core half 14.

Advantageously, the material of the insulating case may be neoprene, santoprene, polyproplene, nylon, polyurethane, or a wide variety of other commercially available insulating materials. Preferably, the material is firm but resilient.

Although the term "half" and "halves" is being used here, it should be understood that the case portions 19 and the ferrite portions 14 need not be of equal size. In the preferred embodiment illustrated, however, they are.

Returning to FIG. 1, the pair of case portions 19,19 are made as one piece and are of resilient material. Each case portion has opposite side walls 20, 22 and an imperforate floor 24 for defining a space with an open top, each for receiving one ferrite portion 14. In FIG. 1, the upper case portion in the figure contains the ferrite portion 14, while the lower case portion does not so that the structure of the case can be examined. Each case portion or half also has a pair of opposite ends which, in the preferred embodiment, include end walls 26,28.

Each end wall has a semi-circular opening 30 for passing the cable 12, which can thus pass through the merged passages or channels 16 of the ferrite portions and through the case portions when they are closed on each other as shown in FIGS. 2 and 3.

Connecting means in the form of hinges 32 on side walls 20, and latches 33 and 34 on side walls 22, hold the case portions together in a closed position around the conductor 12, with the open tops of the case portions facing each other. Latches on both side walls can be used instead of a hinge-plus-latch combination.

The ferrite portion 14 in each case portion 19, is retained in its case portion by a pair of obliquely extending fingers 36, extending from the semi-circular openings 30, into passage 16, but not touching the ferrite portion 14 when it sits in its case portion. Only if the case is inverted do the fingers engage the ferrite portions and keep them from falling out of the case portions.

A raised platform 40 is provided on the floor 24 of at least one, but preferably both case portions. The platform is made as one piece with the case portions and extends into engagement with the ferrite portion in each case portion. The platform is spaced inwardly of the opposite side walls and the ends of the case portions for allowing each ferrite portion to rock in any and all directions around the platform so that when the case portions are in the closed position, the faces 15 engage flatly against each other.

In a preferred embodiment of the invention, platform 40 is cylindrical and rises above the floor 24 of each case portion 19, 19 by about 1 mm, or advantageously about 0.5 to 2.5 mm.

The size of each case portion and its platform 40, is selected with respect to the size of the ferrite portion 14, so that the upper edge and faces 15 of the ferrite portion extends slightly above the upper open top of each case half. When the case halves are closed, their faces, 15, 15, nearest the hinges 32, first come into contact with each other and squarely engage each other, while the ferrite portions pivot or rock on the platform. FIG. 3 shows a position just before the latch is closed, prior to engaging the female latches 33 over the male latches 34. Latch covering ears 42 are provided for receiving the latches 33 so that once the case is closed it can only be opened using a tool.

Due to the resiliency of the material of the case halves, which can be injection molded of a single piece of material, the floor 24 of each case half will bulge outward slightly (phantom lines in FIG. 2) as the platforms 19 are pressed outwardly. This helps bias the ferrite portions toward each other and squarely engage the faces, 15, 15 against each other.

This accommodates variations in sizes and imperfections in the flat faces 15, which are generally ground to a flat configuration. In an extreme case shown in FIG. 2, the face 15 of the lower ferrite portion 14 has been ground so that it is not parallel to the lower surface of the ferrite portion but rather at an angle. The upper ferrite portion 14 is shown correctly ground. Even with this mismatching, the faces 15, 15 squarely engage each other because the lower ferrite portion 14 is permitted to rock about the platform 14. To help further facilitate this rocking action, which takes place in any direction around the platform because of its being spaced from both ends and both sides of the case half, an annular ridge is provided around the perimeter and on the upper surface of each platform 40 as best shown in FIG. 1. This permits the perimeter of the platform to be compressed somewhat by the tilted ferrite portions.

Each of the opposite side walls 20, 23 also have thin walled portions produced by recesses 37 so that a screwdriver or other tool can be used for extracting a ferrite portion from its respective case portion.

Each semi-circular opening 30 also includes one or two inwardly extending triangular teeth in FIG. 3, which are using in conjunction with a rectangular tooth 38 at the base of each semi-circular opening 30.

While a specific embodiment of the invention has been shown and described in detail to illustrate the application of the principles of the invention, it will be understood that the invention may be embodied otherwise without departing from such principles.

What is claimed is:

1. A noise suppressor for engagement over a conductor, comprising:

a pair of case portions made of resilient material, each case portion having opposite side walls and an imperforate floor for defining a space with an open top for receiving a ferrite portion, and ends for passing a conductor;

connecting means for holding the case portions together in a closed position around a conductor with the open tops of the case portions facing each other;

a ferrite portion in each case portion, each ferrite portion having a channel and at least one face, said faces engaging each other and said channels merging when said case portions are in the closed position for passage of a conductor through said channel; and a single central closed and raised platform on said imperforate floor of at least one of said case portions, said platform being made as one piece with said at least one case portion and extending into the space and into engagement of the ferrite portion in said at least one case portion, said platform being spaced inwardly of said opposite side walls and inwardly of said ends of said at least one case portion for allowing said ferrite which is in engagement with said platform to rock so that when said case portions are in the closed position, said faces engage flatly against each other—biasing of both ferrite portions toward one another occurring by slight distortion of the floor of the at least one case portion once the case portions are connected together.

2. A suppressor according to claim 1, wherein the case portions each include a raised platform.

3. A suppressor according to claim 2, wherein the platforms are cylindrical.

4. A suppressor according to claim 1, wherein the case portions are made of one piece of resilient material.

5. A sleeve according to claim 4, wherein said case portions each have an end well at each end thereof with an opening for receiving a conductor.

6. A suppressor according to claim 5, wherein the opening in each end wall of each case portion includes an obliquely inwardly extending finger for extending into the channel of the ferrite portion.

7. A suppressor according to claim 1, wherein the connecting means comprise at least one hinge connected between one of the opposite side walls of each case portion and a latch for engaging the opposite side walls of each case portion.

8. A suppressor according to claim 1, wherein each case portion includes a thin wall portion in at least one of said opposite side walls thereof.

9. A suppressor according to claim 1, wherein each face portion includes an end wall at each end thereof with a recess, an obliquely inwardly extending finger near each recess for engaging a channel of each ferrite portion, and at least one additional tooth extending in the recess for engaging a conductor.

* * * * *